(12) United States Patent
Frana et al.

(10) Patent No.: US 6,479,764 B1
(45) Date of Patent: Nov. 12, 2002

(54) VIA STRUCTURE WITH DUAL CURRENT PATH

(75) Inventors: Andrew James Frana, Oronoco; Don Alan Gilliland, Rochester, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/568,149

(22) Filed: May 10, 2000

(51) Int. Cl.7 .......................... H01R 12/04; H05K 1/11
(52) U.S. Cl. .......................... 174/262; 174/264
(58) Field of Search .................. 174/262–266; 361/792–795

(56) References Cited

U.S. PATENT DOCUMENTS 5,689,091 A * 11/1997 Hamzehdoost et al. ..... 174/255
5,949,030 A * 9/1999 Fasano et al. .............. 174/262
5,985,521 A 11/1999 Hirano et al.
6,046,909 A 4/2000 Joy
6,137,064 A * 10/2000 Kiani et al. ................. 174/266

* cited by examiner

Primary Examiner—Kamand Cuneo
Assistant Examiner—Jeremy Norris
(74) Attorney, Agent, or Firm—Konrad Raynes Victor & Mann, LLP (57) ABSTRACT

Provided is a via for use in a printed circuit board or integrated circuit having first, second, third, and fourth layers. The via includes a first path capable of transmitting a forward current from the first to the second layer and a second path capable of transmitting a return current resulting from the forward current from the third to the fourth layer to return to a source of the forward current.

39 Claims, 8 Drawing Sheets

VIA STRUCTURE WITH DUAL CURRENT PATH

BACKGROUND OF THE INVENTION

1. Field of the Invention

The present invention relates to a via structure that reduce inductance in the current path when used in printed circuit boards and integrated circuits.

2. Description of the Related Art

A printed circuit board comprises a thin plate formed of multiple layers onto which chips and other electronic components, such as integrated circuits, are mounted. Computers consist of one or more boards, often called cards or adapters. Each layer of the printed circuit board includes metal paths ending in contact pads. An electronic device would transfer signals to a network of metal paths through the contact pad to communicate over the metal paths with other electronic devices on the same or different layers of the substrate. A via structure extends through holes in the layers and interfaces with contact pads on different layers to allow signals to travel between layers through the via. In this way, the via provides a conductive path to communicate between conductive layers.

A forward current or signal transmitted from a source device on one layer to a target device on another will pass through a via. After reaching the target device, a return current will travel on one or more voltage layers, such as a ground layer, to the source device that initiated the current. The return current will attempt to follow the path closest to the original signal on the voltage layer to take the path of least impedance. However, the return current may have to diverge from the closest path of the forward current to a structure, such as another via or a decoupling cap, in order to move from one voltage layer to another that is in communication with the source device. This divergence from the closest path following the signal trace path of the forward current increases the loop area of the forward and return currents. Increasing the loop area results in a corresponding increase in inductance and, hence, electronic emissions, i.e., noise. Such increased emissions and noise increases cross-talk, interferes with other signals in the system and can radiate from the card.

Thus, there is a need in the art for improved techniques for controlling the path of the return current in order to minimize inductance and electronic emissions and interference.

SUMMARY OF THE PREFERRED EMBODIMENTS

To overcome the limitations in the prior art described above, preferred embodiments disclose a via for use in a printed circuit board or integrated circuit having first, second, third, and fourth layers. The via includes a first path capable of transmitting a forward current from the first to the second layer and a second path capable of transmitting a return current resulting from the forward current from the third to the fourth layer to return to a source of the forward current.

By providing paths in the same via structure for the forward and return current, preferred embodiments allow the return current to follow the closest path on a different plane to the signal trace of the forward current, thereby minimizing the loop area and reducing inductance.

BRIEF DESCRIPTION OF THE DRAWINGS

Referring now to the drawings in which like reference numbers represent corresponding parts throughout:

FIG. 1b illustrates a cross-sectional view perpendicular to the axis of the via structure shown in FIG. 1a;

FIG. 2b illustrates a cross-sectional view perpendicular to the axis of the via structure shown in FIG. 2a;

FIG. 4 illustrates a cross-sectional view along the axis of the via structure shown in FIG. 1a.

DETAILED DESCRIPTION OF THE PREFERRED EMBODIMENTS

In the following description, reference is made to the accompanying drawings which form a part thereof and which illustrate several embodiments of the present invention. In the drawings, depicted elements are not necessarily drawn to scale and like or similar elements may be designated by the same reference numeral throughout the several views. Further, it is understood that other embodiments may be utilized and structural and operational changes may be made without departing from the scope of the present invention.

Figure 1A:
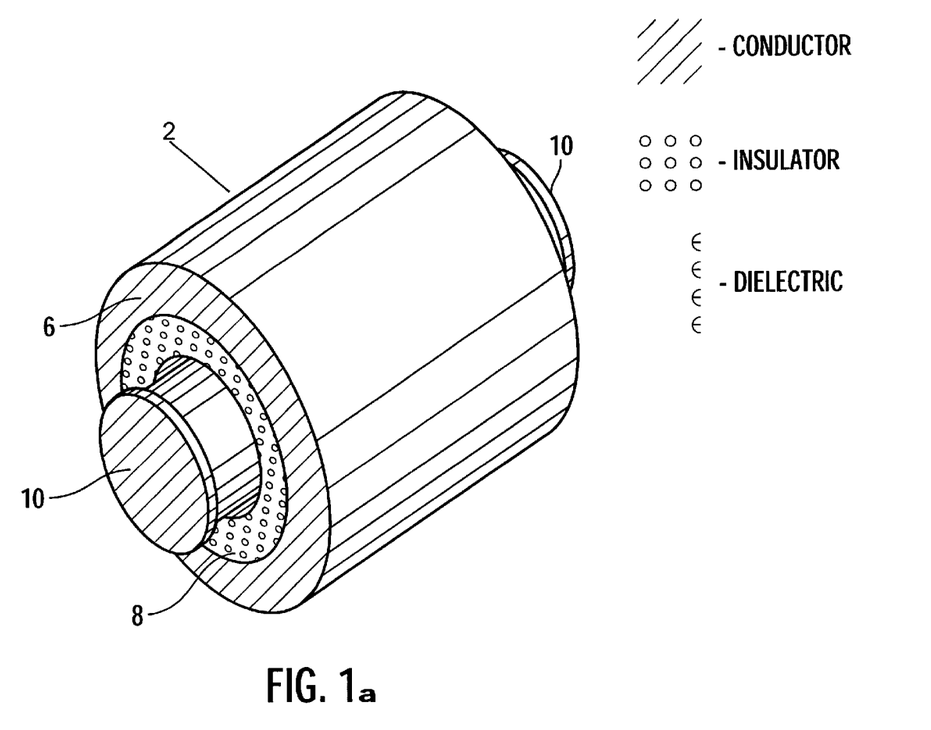
FIG. 1a illustrates a perspective view of a via structure in accordance with a first embodiment of the present invention.
Figure 1B:
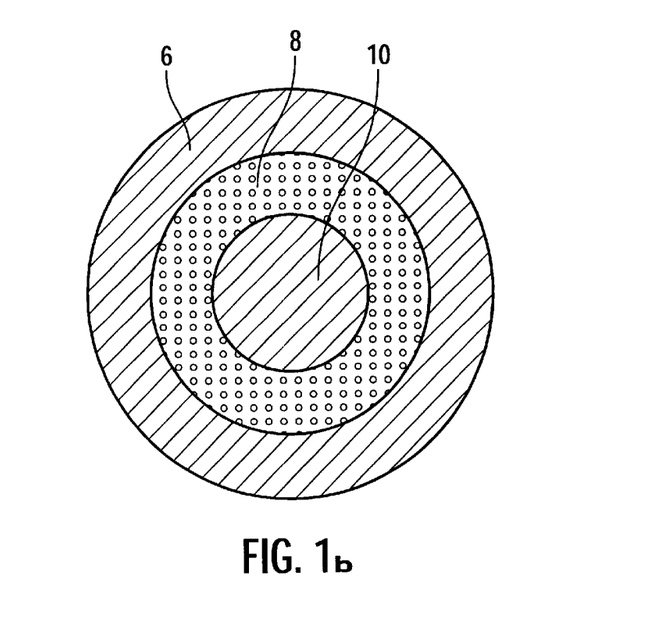

FIGS. 1a and 1b illustrate a first preferred embodiment via structure 2. FIG. 1a shows a cylindrical via structure 2 having two adjacent and coaxial annular regions 6 and 8 and a cylindrical signal conductor member 10 disposed in the center that has end portions extending outward from the via structure 2. FIG. 1b provides a cross-sectional view of the via structure 2 with the annular regions 6 and 8 and center signal conductor member 10. The ends of the signal conductor 10 are designed to interface with contact pads on different layers of a printed circuit board to allow current to transfer from one layer to another. Further, the annular region 6 is also designed to interface with contact pads on different layers to allow the return current to flow from one layer to another.

In preferred embodiments, the annular region 8 is comprised of an insulative material and the annular region 6 and signal conductor 10 structures are formed of a conductive material through which the initial signal and return current may flow.

Figure 2A:
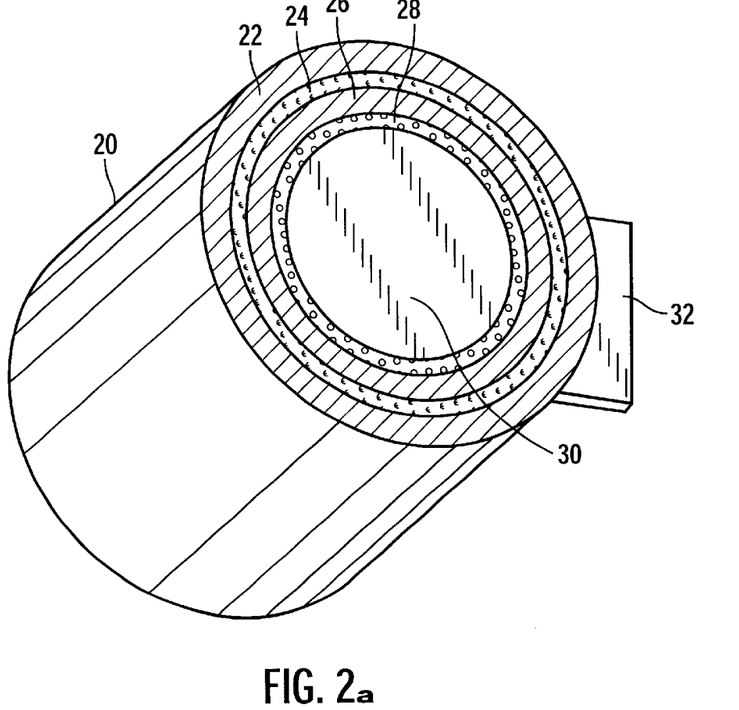
FIG. 2a illustrates a perspective view of a via structure in accordance with a second embodiment of the present invention.
Figure 2B:
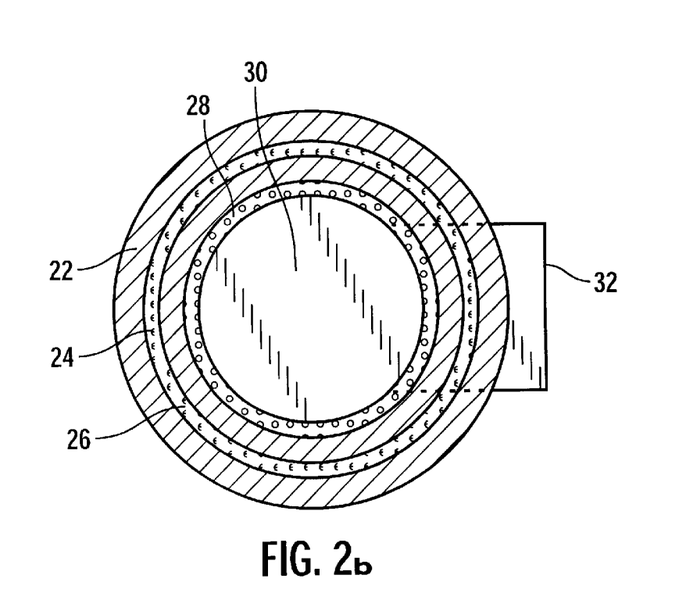

FIGS. 2a and 2b illustrate a second preferred embodiment of a via structure 20. FIG. 2a shows a cylindrical via structure 20 having three adjacent and coaxial annular regions 22, 24, 26, 28 and a cylindrical signal conductor member 30 in the center, all coaxial. The signal conductor member 30 includes an extending portion 32 that traverses through the annular regions 22, 24, 26, 28 and exits the via structure 20 as shown in FIG. 2a.

FIG. 2b provides a cross-sectional view of the via structure 20 with the three annular regions 22, 24, 26,28 and center signal conductor member 30, having the extending portion 32.

In preferred embodiments, the annular regions 22 and 26 and signal conductor 30 and extending portion 32 are formed of a conductive material. The annular region 28 is comprised of an inductive material and annular region 24 is comprised of a dielectric material capable of functioning as both an insulator and capacitor at higher frequencies. The combination of the dielectric annular region 24 between annular conductive regions 22 and 26 forms a capacitance for currents of sufficiently high frequency.

The extending portion 32 of the signal conductor 30 in preferred embodiments is attached to the cylindrical body of the signal conductor 30 and is comprised of the same conductive material.

The via structures shown in FIGS. 1a, b and 2a, b provide two paths through which a forward signal and return current may flow. In FIGS. 1a, b, the forward path includes the center signal conductor body 10 and the return path comprises the conductive annular region 6. In FIGS. 2a, b, the forward path includes the signal conductor body 30 and extending member 32 and the return path comprises the capacitance formed by the dielectric annular region 24 and surrounding conductive regions 22 and 26.

Figure 3:
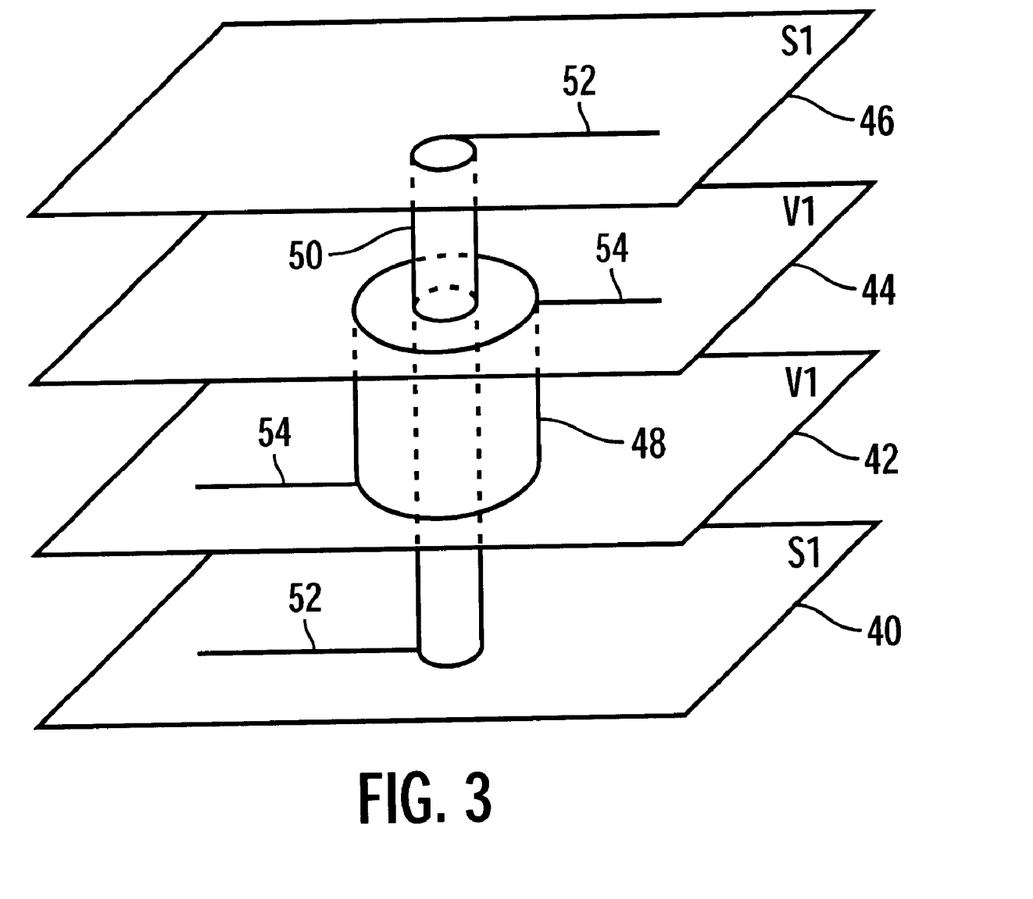
FIG. 3 illustrates a perspective view of the via structure of FIGS. 1a, b disposed through layers.

FIG. 3 illustrates a perspective view of the via structure of the embodiment shown in FIGS. 1a, b disposed through holes in layers 40, 42, 44, and 46 of a printed circuit board to provide a forward signal path for a forward current from a source device and a return path for the return current between voltage layers 42 and 44 having the same voltage ($V_1$), such as a ground voltage of zero. The via structure 48 has a signal conductor member 50 extending through both ends of the via body 48 as shown in FIG. 1a. The signal conductor member 50 extends through the via body 48 and contacts signal layers 40 and 46. Within the via structure 48 is another conductive annular region 6 that surrounds the signal conductor 50 and is in contact with the voltage layers 42 and 44.

A forward current 52 is transmitted from a source device through signal layer 40 to a target device on signal layer 46. After reaching the target device, a return current 54 would return along the voltage layer 44, or ground, through the conductive annular region, and then exit onto voltage layer 42, all the while aligned as close as possible with the signal trace of the forward current 52 on the adjacent voltage layers.

Figure 4:
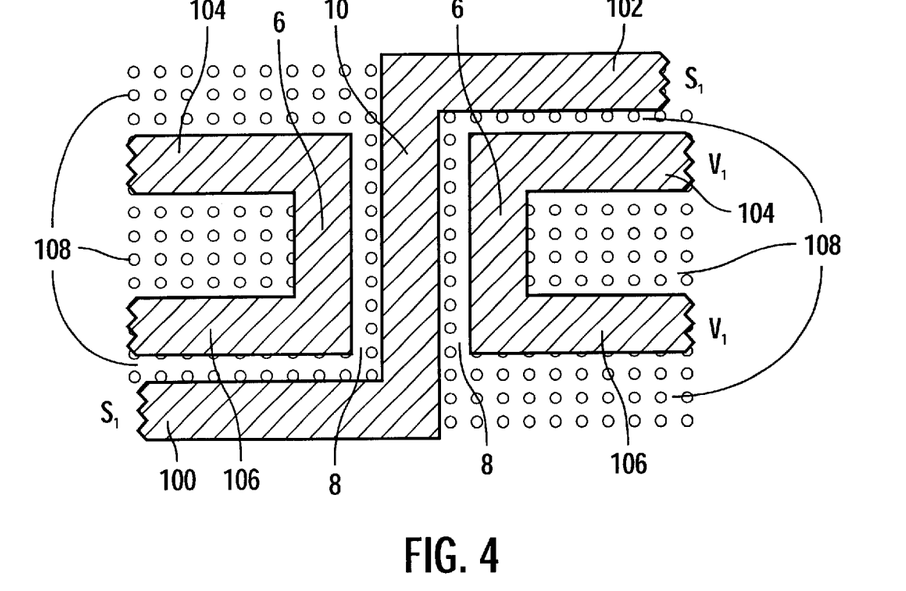
Figure 5:
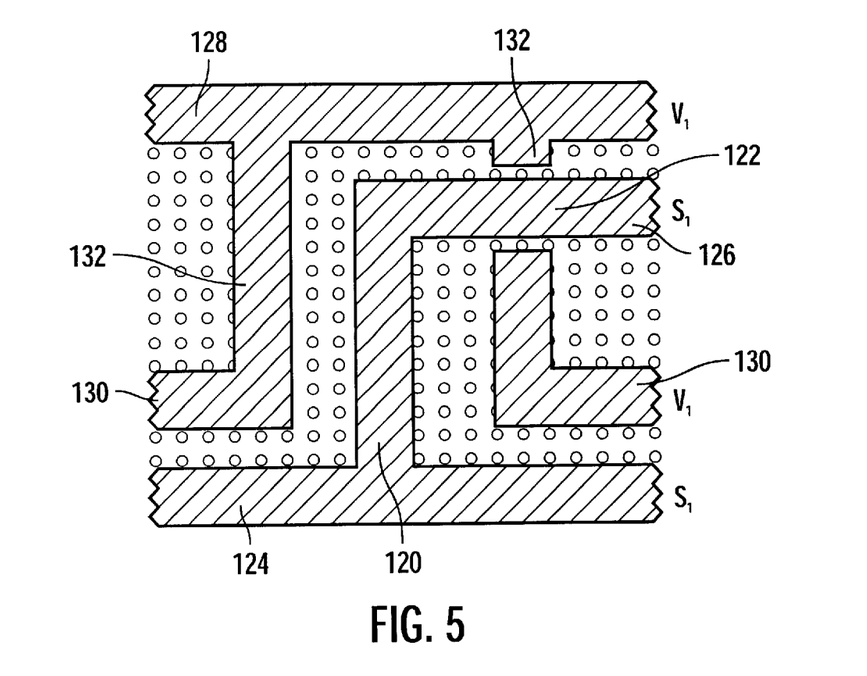
FIGS. 5–9 illustrate cross-sectional views along the axis of alternative embodiments of the via structure.
Figure 6:
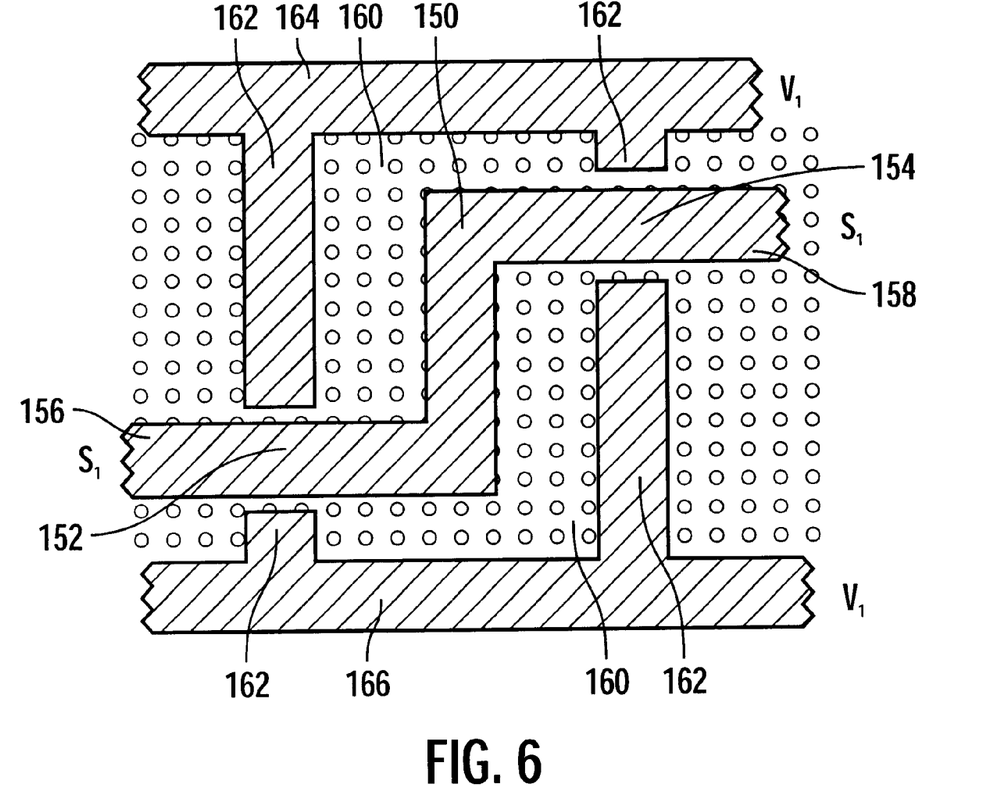

FIGS. 4–9 illustrate different embodiments of the via structure in accordance with the invention. Conductive material is represented as diagonal lines, insulative material as circles, and dielectric material as the epsilon character. In FIGS. 4–6, the return path uses voltage layers having the same voltage $V_1$, whereas in FIGS. 7–9, the voltage layers have different voltages $V_1$, $V_2$. Further, in FIGS. 4–9, the insulative areas and the conductive contact areas on the layers are shown as integral with the insulator and conductive parts of the via. However, in alternative manufacturing designs, the conductive and insulative portions of the layers and via structure may be formed from different materials and not form a single integral structure.

FIG. 4 provides a vertical cross-sectional view of the via structure shown in FIGS. 1a, b where the center conductor 10 allows the forward current to flow between signal layers $S_1$, $S_1$ and the annular conductor region 6 allows the return current to flow between voltage layers $V_1$. In this embodiment, the two signal layers ($S_1$ and $S_1$) have the same voltage and voltage layers ($V_1$ and $V_1$) have the same voltage, such as a ground voltage of zero. The signal layers ($S_1$ and $S_1$) have conductive regions 100 and 102 that contact the center conductor 10. The forward current flows through the center conductor member 10 to flow between the conductive regions 100 and 102 of the two signal layers. The voltage layers ($V_1$ and $V_1$) have conductive regions 104 and 106 that contact the annular conductive region 6, where return current flows between the conductive regions 100 and 104 through the annular conductive region 6. The annular insulative region 8 is shown. The printed circuit board, through which the via is inserted, includes insulative portions 108 that surround the via structure.

FIG. 5 illustrates an alternative embodiment, where a center signal conductor 120 has an extending member 122, such as extending member 32 shown in FIGS. 2a, b, to provide a path for the forward current to flow between signal layers $S_1$ and $S_1$. Conductive regions 124 on one signal layer $S_1$ contacts the center signal conductor and conductive region 126 on the other signal layers $S_1$ contacts the extending member 122 to allow the forward current to flow between the signal layers $S_1$ and $S_1$. Conductive regions 128 and 130 on voltage layers $V_1$ and $V_1$ contact the conductive annular region 132 so that return current can flow from the conductive regions 128 and 130 on the voltage layers $V_1$ and $V_1$ through the conductive annular region 132.

FIG. 6 illustrate a further embodiment, where a center signal conductor 150 has extending members 152 and 154, such as the extending member 32 shown in FIGS. 2a, b, to provide a forward path between conductive regions 156 and 158 on signal layers $S_1$ and $S_1$ annular insulative region 160 is surrounded by annular conductive region 162 that provides a return path between the conductive paths 164 and 166 on voltage layers $V_1$, having the same voltage.

Figure 7:
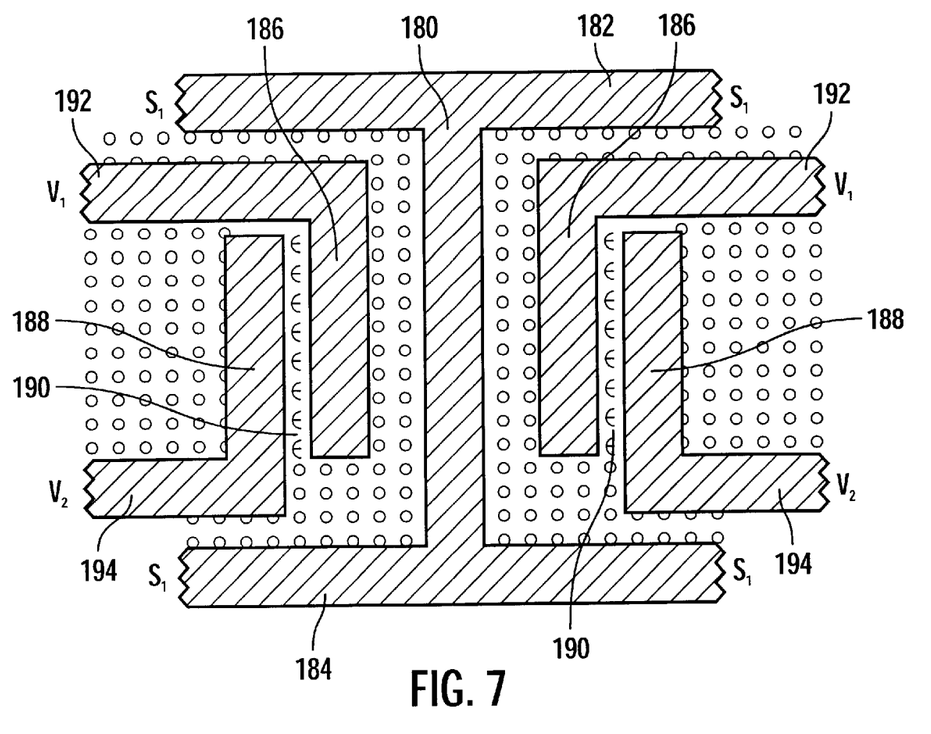

FIG. 7 illustrates a further embodiment where a center signal conductor 180 provides a forward path for the forward current to flow between the conductive regions 182 and 184 on signal layers $S_1$ and $S_1$ The combination of annular conductors 186 and 188 and annular dielectric region 190 therebetween forms a capacitance through which the return current may flow from the conductive regions 192 and 194 on voltage layers $V_1$ and $V_2$. The annular dielectric region 190 is needed when the voltage layers have different voltages $V_1$ and $V_2$ to prevent direct current resulting from the voltage difference from flowing between the layers, which could cause a short. Specifically, in FIG. 7, the conductive region 192 of the upper voltage layer $V_1$ is formed to contact the inner annular conductive region 186, but not the outer annular conductive region 188, and the conductive region 194 of the lower voltage layer $V_2$ is formed to contact the outer annular conductive region 188, but not the inner annular conductive region 186. This arrangement allows the dielectric region 190 surrounded by conductive regions 186 and 188 to form a capacitance to allow return current to flow, but insulates direct current resulting from the voltage differences in the voltage layers $V_1$ and $V_2$ from flowing between the different voltage layers $V_1$ and $V_2$. In this way, for return current, the dielectric region 190 functions as a path to allow the return current to flow between the annular conductive regions 186 and 188, and hence the different voltage layers $V_1$ and $V_2$.

Figure 8:
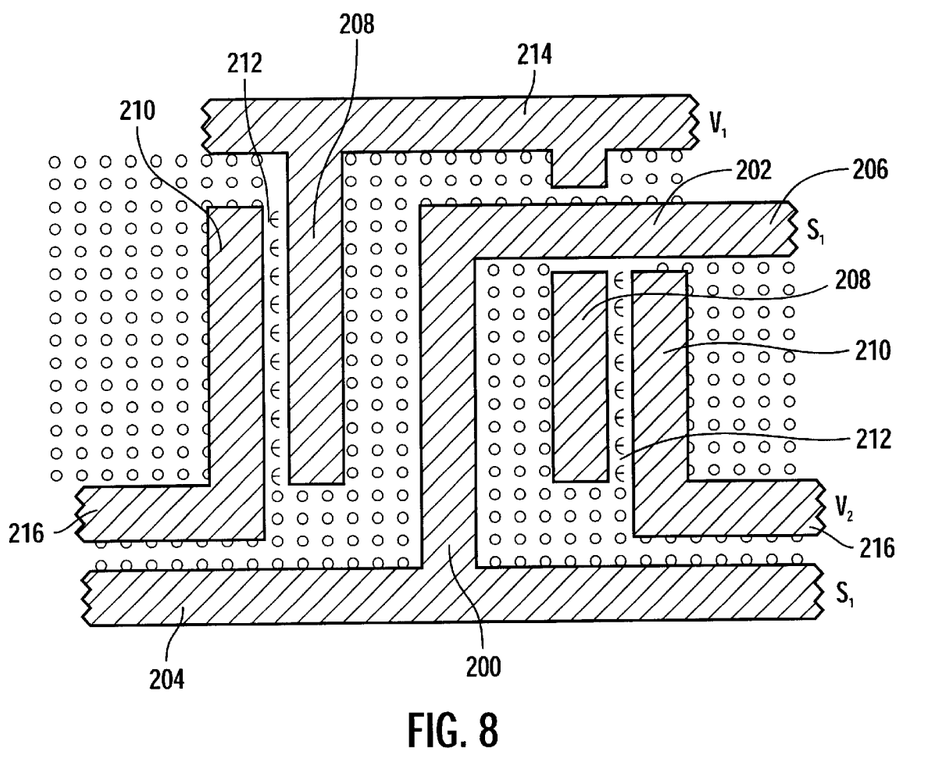

FIG. 8 illustrates a further embodiment where center signal conductor 200 has an extending member 202, such as extending member 32 in FIGS. 2a, b, to provide a forward path for the forward current to flow between the conductive regions 204 and 206 on signal layers $S_1$ and $S_1$. The annular conductive regions 208 and 210 surround the dielectric annular region 212 to form a capacitance for return current to flow from the conductive regions 214 and 216 on voltage layers $V_1$ and $V_2$, respectively. As with FIG. 7, each conductive region 214 and 216 contacts a different conductive annular region 210 and 208, respectively, to allow the combination of the dielectric region 212 and conductive regions 208 and 210 to form an insulator between voltage layers $V_1$ and $V_2$ to prevent direct current from flowing between the layers and to form a capacitance for the return current to flow between voltage layers $V_1$ and $V_2$.

Figure 9:
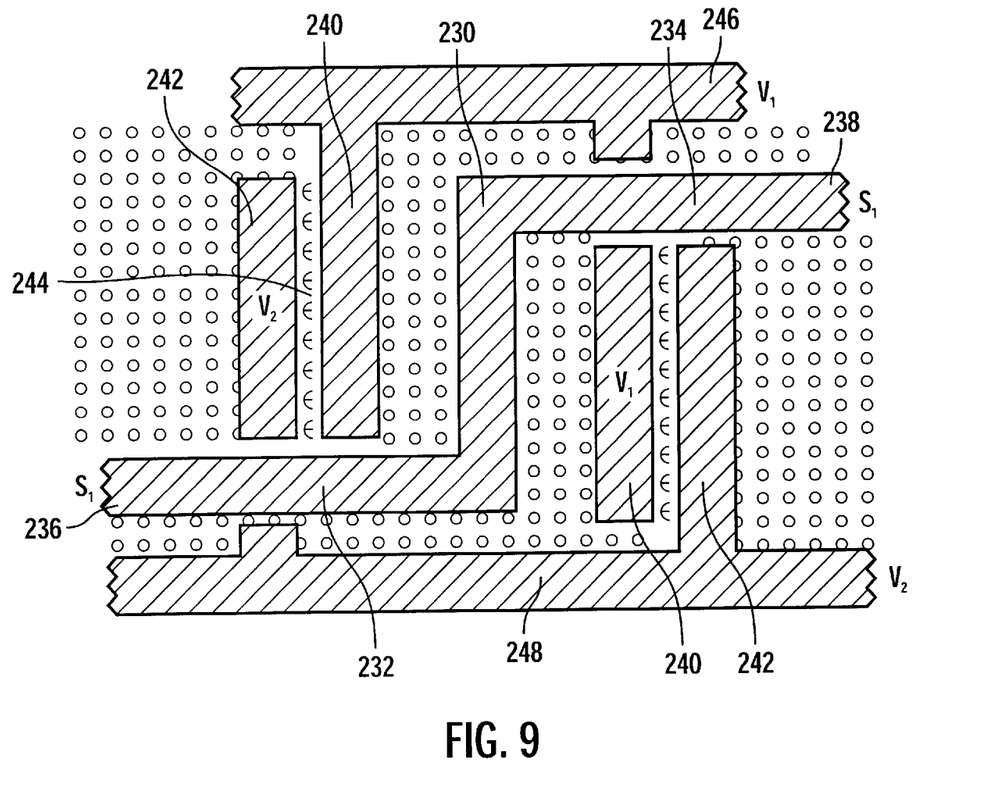

FIG. 9 illustrate a still further embodiment, where center signal conductor 230 has extending members 232 and 234, such as extending member 32 in FIGS. 2a, b, to provide a forward path for the forward current to flow between the conductive regions 236 and 238 on signal layers $S_1$ and $S_1$. The annular conductive regions 240 and 242 surround the dielectric annular region 244 to form a capacitance for return current to flow from the conductive regions 246 and 248 on voltage layers $V_1$ and $V_2$, respectively. As with FIG. 7, each conductive region 246 and 248 contacts a different conductive annular region 240 and 242, respectively. In this way, the combination of the dielectric region 244 and conductive regions 240 and 242 forms an insulator between voltage layers $V_1$ and $V_2$ to prevent direct current from flowing therebetween and forms a capacitance for the return current to flow between voltage layers $V_1$ and $V_2$. Thus, the dielectric region 244 only allows return current to flow between the conductive annular regions 240 and 242, but not direct current resulting from the difference in the voltages of voltage layers $V_1$ and $V_2$.

Thus, the preferred embodiments of the via structure provide two paths for different arrangements of the signal and voltage (ground) layers to allow a return current to follow, i.e., shadow as close as possible the signal trace of the initial forward current in order to minimize inductance and the loop area. In the above described embodiments, the return current follows the signal trace of the forward current on the voltage layer due to the phenomena of mutual inductance where a return current is attracted to follow the closest plane to minimize inductance between the forward and return current. The preferred embodiment via structure enables the return current to follow the path of minimum inductance by providing a via structure through which both a forward and return current may travel. Further, in preferred embodiments the dielectric annular region and signal conductor are coaxial.

The advantages of the preferred embodiments are significant as the signal and voltage planes on a board have been shown to radiate the emissions from the circuit board due to prior art arrangements that require the return current to diverge from the path of minimum inductance to use a decoupling circuit. Moreover, not only do the preferred embodiments provide a dual path via to allow the return current to follow the path of least inductance, but the outside layer of the via comprises a conductive structure that shields the circuit board from the current in the via.

The preferred embodiment via structure allows the use of the dual current path via to replace decoupling circuits located on the printed circuit board for use by return paths. The preferred embodiment via structure provides many advantages over the prior art use of decoupling circuits for the return current. As discussed, decoupling circuits cause the return current to form a larger loop area because of physical constraints in where the decoupling circuits can be placed. Further, the preferred embodiment via structure is physically smaller and less expensive than decoupling circuits. In this way, the preferred embodiment coaxial via structure may be used in lieu of a decoupling circuit and conserve printed circuit board space, reduce cost, and reduce inductance and electronic emissions.

Preferred embodiments described the metal lines or paths and contacts on the upper surface of the layers. However, in further embodiments the via signal conductor and dielectric annular region can be used to allow a forward and return currents to move from a upper or lower surface of a substrate to an upper or lower surface of the same or a different substrate. The layers described herein may comprise include the outermost layers as well as the inner layers of the printed circuit board.

In preferred embodiments, there may be any number of additional layers between any of the illustrated signal and voltage layers.

In further embodiments, the via structure may provide conductive regions to branch to multiple layers for the forward or return current exiting the via structure. In this way, the forward or return current can flow from one input layer to multiple output layers.

Preferred embodiments described layers of substrates and how the via provides communication therebetween. In preferred embodiments, the layers comprise the layers of a printed circuit board which may be part of a card for a computer. The card may include one or more electronic devices mounted onto the printed circuit board, such as a semiconductor package comprising a package substrate. The forward and return current would be generated by electronic devices on the printed circuit board.

In still further embodiments, the vias may be used to allow forward and return currents to flow between layers within an integrated circuit chip.

In summary, preferred embodiments disclose a via for use in a printed circuit board or integrated circuit having first, second, third, and fourth layers. The via includes a first path capable of transmitting a forward current from the first to the second layer and a second path capable of transmitting a return current resulting from the forward current from the third to the fourth layer to return to a source of the forward current.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. Since many embodiments of the invention can be made without departing from the spirit and scope of the invention, the invention resides in the claims hereinafter appended.

What is claimed is:

1. A via structure for use in a printed circuit board having first, second, third, and fourth layers, comprising:
   a first path transmitting a forward current from the first to the second layer; and
   a second path transmitting a return current resulting from the forward current from the third to the fourth layer to return to a source of the forward current,
   wherein the via is disposed within openings in the first, second, third and fourth layers, and wherein the first path transmits the forward current to at least one additional layer as well as the second layer and wherein the second path transmits the return current to at least one additional layer as well as the fourth layer.

2. The via structure of claim 1, wherein the first path comprises a signal conductor member and the second path comprises an annular conductive region, wherein the signal conductor member is disposed within the annular conductive region, and wherein the annular conductive region and signal conductor member are coaxial.

3. The via structure of claim 2, wherein the third and fourth layers are in contact with opposite ends of the annular conductive region, and wherein the third and fourth layers have a same voltage.

4. A via structure for use in a printed circuit board having first, second, third, and fourth layers, comprising:
   a first path comprising a signal conductor member transmitting a forward current from the first to the second layer, wherein the signal conductor member includes a first end and a second end and an extending member therebetween, wherein the extending member contacts the first layer; and a second path transmitting a return current resulting from the forward current from the third to the fourth layer to return to a source of the forward current, wherein the via is disposed within openings in the first, second, third and fourth layers.

5. The method of claim 4, wherein the extending member in contact with the first layer comprises a first extending member and wherein a second extending member between the first end and the second end of the signal conductor member contacts the second layer.

6. The method of claim 4, wherein the second end contacts the second layer.

7. A via structure for use in a printed circuit board having first, second, third, and fourth layers, comprising:

a first path comprising a signal conductor member transmitting a forward current from the first to the second layer;

a second path transmitting a return current resulting from the forward current from the third to the fourth layer to return to a source of the forward current, wherein the second path comprises first and second annular conductive regions with an annular dielectric region therebetween, wherein the first and second annular conductive regions and annular dielectric region are coaxial, wherein the via is disposed within openings in the first, second, third and fourth layers.

8. The via structure of claim 7, wherein the third layer is in contact with the first annular conductive region and the fourth layer is in contact with the second annular conductive region, and wherein a first end of the signal conductor member is in contact with the first layer and a second end of the signal conductor member is in contact with the second layer.

9. The via structure of claim 7, wherein an insulative annular region is between the signal conductor member and the second path.

10. The via structure of claim 7, wherein the third layer is in contact with the first annular conductive region and the fourth layer is in contact with the second annular conductive region, wherein the signal conductor member includes a first end and a second end and an extending member therebetween, wherein the extending member contacts the first layer and the second end of the signal conductor member contacts the second layer.

11. The via structure of claim 7, wherein the third layer is in contact with the first annular conductive region and the fourth layer is in contact with the second annular conductive region, wherein the signal conductor member includes a first end and a second end and first and second extending members therebetween, wherein the first extending member contacts the first layer and the second extending member contacts the second layer.

12. The method of claim 7, wherein the first path transmits a forward current path to at least one additional layer as well as the second layer and wherein the second path transmits the return current to at least one additional layer as well as the fourth layer.

13. A via structure for use in a printed circuit board having first, second, third, and fourth layers, comprising:

a first path comprising a signal conductor member transmitting a forward current from the first to the second layer, a second path comprising first and second annular conductive regions with an annular dielectric region therebetween, wherein the first and second annular conductive regions and annular dielectric region are coaxial, wherein the second path transmits a return current resulting from the forward current from the third to the fourth layer to return to a source of the forward current, wherein the via is disposed within openings in the first, second, third and fourth layers, and wherein the third and fourth layers have different voltages, and wherein the second path functions as an insulator with respect to direct current resulting from the differences in the voltages between the third and fourth layers.

14. A printed circuit board, comprising:

a first, second, third and fourth layer;

at least one via structure disposed within openings in the first, second, third, ad fourth layers, comprising:

(i) a first path transmitting a forward current from the first to the second layer; and (ii) a second path transmitting a return current resulting from the forward current from the third to the fourth layer to return to a source of the forward current, wherein the first path is capable of transmitting the forward current to at least one additional layer as well as the second layer and wherein the second path is capable of transmitting the return current to at least one additional layer as well as the fourth layer.

15. The printed circuit board of claim 14, wherein the first path comprises a signal conductor member and the second path comprises an annular conductive region, wherein the signal conductor member is disposed within the annular conductive region, and wherein the annular conductive region and signal conductor member are coaxial.

16. The printed circuit board of claim 15, wherein the third and four layers are in contact with opposite ends of the annular conductive region, and wherein the third and fourth layers have a same voltage.

17. A printed circuit board, comprising:

a first, second, third and fourth layers;

at least one via structure disposed within openings in the first, second, third, and fourth layers, comprising:

(i) a first path transmitting a forward current from the first to the second layer including a signal conductor member having a first end and a second end and an extending member therebetween, wherein the extending member contacts the first layer; and (ii) a second path transmitting a return current resulting from the forward current from the third to the fourth layer to return to a source of the forward current.

18. The printed circuit board of claim 17, wherein the extending member in contact with the first layer comprises a first extending member and wherein a second extending member between the first end and the second end of the signal conductor member contacts the second layer.

19. The printed circuit board of claim 17, wherein the second end contacts the second layer.

20. A printed circuit board, comprising:

a first, second, third and fourth layers;

at least one via structure disposed within openings in the first, second, third, and fourth layers, comprising:

(i) a first path transmitting a forward current from the first to the second layer comprising a signal conductor member; and (ii) a second path transmitting a return current resulting from the forward current from the third to the fourth layer to return to a source of the forward current, comprising first and second annular conductive regions with an annular dielectric region therebetween, wherein the first and second annular conductive regions and annular dielectric region are coaxial.

21. The printed circuit board of claim 20, wherein the third layer is in contact with the first annular conductive region and the fourth layer is in contact with the second annular conductive region, and wherein a first end of the signal conductor member is in contact with the first layer and a second end of the signal conductor member is in contact with the second layer.

22. The printed circuit board of claim 20, wherein an insulative annular region is between the signal conductor member and the second path.

23. The printed circuit board of claim 20, wherein the third layer is in contact with the first annular conductive region and the fourth layer is in contact with the second annular conductive region, wherein the signal conductor member includes a first end and a second end and an extending member therebetween, wherein the extending member contacts the first layer and the second end of the signal conductor member contacts the second layer.

24. The printed circuit board of claim 20, wherein the third layer is in contact with the first annular conductive region and the fourth layer is in contact with the second annular conductive region, wherein the signal conductor member includes a first end and a second end and first and second extending members therebetween, wherein the first extending member contacts the first layer and the second extending member contacts the second layer.

25. The printed circuit board of claim 20, wherein the first path transmits the forward current path to at least one additional layer as well as the second layer and wherein the second path transmits the return current to at least one additional layer as well as the fourth layer.

26. A printed circuit board, comprising:
a first, second, third and fourth layers;
at least one via structure disposed within openings in the first, second, third, and fourth layers, comprising:
(i) a first path transmitting a forward current from the first to the second layer comprising a signal conductor member, and
(ii) a second path transmitting a return current resulting from the forward current from the third to the fourth layer to return to a source of the forward current, comprising first and second annular conductive regions with an annular dielectric region therebetween, wherein the first and second annular conductive regions and annular dielectric region are coaxial, wherein the third and fourth layers have different voltages, and wherein the second path functions as an insulator with respect to direct current resulting from the differences in the voltages between the third and fourth layers.

27. An integrated circuit, comprising:
a first, second, third and fourth layers;
at least one via structure disposed within openings in the first, second, third, and fourth layers, comprising:
(i) a first path capable of transmitting a forward current from the first to the second layer; and
(ii) a second path capable of transmitting a return current resulting from the forward current from the third to the fourth layer to return to a source of the forward current, and wherein the first path transmits the forward current to at least one additional layer as well as the second layer and wherein the second path transmits the return current to at least one additional layer as well as the fourth layer.

28. The integrated circuit of claim 27, wherein the first path comprises a signal conductor member and the second path comprises an annular conductive region, wherein the signal conductor member is disposed within the annular conductive region, and wherein the annular conductive region and signal conductor member are coaxial.

29. The integrated circuit of claim 28, wherein the third and fourth layers are in contact with opposite ends of the annular conductive region, and wherein the third and fourth layers have a same voltage.

30. An integrated circuit, comprising:
a first, second, third and fourth layers;
at least one via structure disposed within openings in the first, second, third, and fourth layers, comprising:
(i) a first path capable of transmitting a forward current from the first to the second layer comprising a signal conductor member having a first end and a second end and an extending member therebetween, wherein the extending member contacts the first layer and the second end contacts the second layer
(ii) a second path capable of transmitting a return current resulting from the forward current from the third to the fourth layer to return to a source of the forward current.

31. The integrated circuit of claim 30, wherein the extending member in contact with the first layer comprises a first extending member and wherein a second extending member between the first end and the second end of the signal conductor member contacts the second layer.

32. The integrated circuit of claim 30, wherein the second end contacts the second layer.

33. An integrated circuit, comprising:
a first, second, third and fourth layers;
at least one via structure disposed within openings in the first, second, third, and fourth layers, comprising:
(i) a first path comprising a signal conductor member transmitting a forward current from the first to the second layer; and
(ii) a second path capable of transmitting a return current resulting from the forward current from the third to the fourth layer to return to a source of the forward current, wherein the second path comprises first and second annular conductive regions with an annular dielectric region therebetween, wherein the first and second annular conductive regions and annular dielectric region are coaxial.

34. The integrated circuit of claim 33, wherein the third and fourth layers have different voltages, and wherein the second path functions as an insulator with respect to direct current resulting from the differences in the voltages between the third and fourth layers.

35. The integrated circuit of claim 33, wherein the third layer is in contact with the first annular conductive region and the fourth layer is in contact with the second annular conductive regions and wherein a first end of the signal conductor member is in contact with the first layer and a second end of the signal conductor member is in contact with the second layer.

36. The integrated circuit of claim 33, wherein an insulative annular region is between the signal conductor member and the second path.

37. The integrated circuit of claim 33, wherein the third layer is in contact with the first annular conductive region and the fourth layer is in contact with the second annular conductive region, wherein the signal conductor member includes a first end and a second end and an extending member therebetween, wherein the extending member contacts the first layer and the second end of the signal conductor member contacts the second layer.

38. The integrated circuit of claim 33, wherein the third layer is in contact with the first annular conductive region and the fourth layer is in contact with the second annular conductive region, wherein the signal conductor member includes a first end and a second end and first and second extending members therebetween, wherein the first extending member contacts the first layer and the second extending member contacts the second layer.

39. The integrated circuit of claim 33, wherein the first path transmits the forward current to at least one additional layer as well as the second layer and wherein the second path transmits the return current to at least one additional layer as well as the fourth layer.

* * * * *